(12) United States Patent
Getreu et al.

(10) Patent No.: US 12,256,493 B1
(45) Date of Patent: Mar. 18, 2025

(54) RAPID IMPLEMENTATION OF HIGH-TEMPERATURE ANALOG INTERFACE ELECTRONICS

(71) Applicants: Ian Getreu, Tigard, OR (US); James A. Holmes, Fayetteville, AR (US); Brandon Dyer, Prairie Grove, AR (US); Jacob Kupernik, Bella Vista, AR (US); Matthew Barlow, Springdale, AR (US); Nicholas Chiolino, Springdale, AR (US); Anthony Matt Francis, Elkins, AR (US)

(72) Inventors: Ian Getreu, Tigard, OR (US); James A. Holmes, Fayetteville, AR (US); Brandon Dyer, Prairie Grove, AR (US); Jacob Kupernik, Bella Vista, AR (US); Matthew Barlow, Springdale, AR (US); Nicholas Chiolino, Springdale, AR (US); Anthony Matt Francis, Elkins, AR (US)

( * ) Notice: Subject to any disclaimer, the term of this patent is extended or adjusted under 35 U.S.C. 154(b) by 190 days.

(21) Appl. No.: 18/121,927

(22) Filed: Mar. 15, 2023

Related U.S. Application Data

(63) Continuation-in-part of application No. 17/412,859, filed on Aug. 26, 2021, now Pat. No. 11,647,582.

(51) Int. Cl.
| | | |
|---|---|---|
| *H05K 1/11* | (2006.01) | |
| *G01V 1/18* | (2006.01) | |
| *H05K 1/18* | (2006.01) | |

(52) U.S. Cl.
CPC ............. *H05K 1/112* (2013.01); *G01V 1/181* (2013.01); *H05K 1/181* (2013.01); *H05K 2201/09227* (2013.01); *H05K 2201/09409* (2013.01); *H05K 2201/09609* (2013.01); *H05K 2201/10015* (2013.01); *H05K 2201/10522* (2013.01)

(58) Field of Classification Search
CPC ......... H05K 1/112; H05K 2201/09227; H05K 2201/09409; H05K 2201/09609
See application file for complete search history.

(56) References Cited

U.S. PATENT DOCUMENTS

| | | | |
|---|---|---|---|
| 4,221,047 A | 9/1980 | Narken et al. | 29/840 |
| 4,231,154 A | 11/1980 | Gazdik et al. | 29/840 |
| 4,602,271 A | 7/1986 | Dougherty, Jr. et al. | 357/80 |
| 4,740,414 A * | 4/1988 | Shaheen | H05K 1/113 |
| | | | 428/428 |
| 4,811,082 A | 3/1989 | Jacobs et al. | 357/80 |
| 4,930,002 A | 5/1990 | Takenaka et al. | 357/75 |
| 6,447,888 B2 | 9/2002 | Suzuki et al. | 428/210 |

(Continued)

*Primary Examiner* — Sherman Ng
(74) *Attorney, Agent, or Firm* — Keisling & Pieper PLC; David B. Pieper; Trent C. Keisling

(57) ABSTRACT

A multi-layer ceramic wiring board is patterned with arrays of footprints for high-temperature surface mounted device active and passive components on one side of the board that is patterned with arrays of standard SMD footprints to enable placement and attachment of components including primary 2-terminal components and active components where the SMD pads are connected through vias and buried-layer interconnect traces to a multiple connection point arrays on the front and back side of the ceramic wiring board. Each pad is connected to multiple instances of the pad grid to connections to be made with a single post-fired print.

3 Claims, 6 Drawing Sheets

(56) References Cited

U.S. PATENT DOCUMENTS

| | | | |
|---|---|---|---|
| 6,992,374 B1* | 1/2006 | Yang | H05K 1/0231 |
| | | | 257/692 |
| 7,084,353 B1* | 8/2006 | Downes | H05K 3/3442 |
| | | | 174/262 |
| 7,915,690 B2 | 3/2011 | Shen | 257/390 |
| 2005/0162839 A1* | 7/2005 | Chan | H05K 1/0231 |
| | | | 361/782 |
| 2006/0232301 A1* | 10/2006 | Morlion | H05K 1/114 |
| | | | 326/126 |
| 2008/0179083 A1* | 7/2008 | Del Rosario | H05K 1/0231 |
| | | | 29/832 |

\* cited by examiner

RAPID IMPLEMENTATION OF HIGH-TEMPERATURE ANALOG INTERFACE ELECTRONICS

CROSS-REFERENCE TO RELATED APPLICATIONS

This application claims priority to and is a continuation-in-part of U.S. patent application Ser. No. 17/412,859 filed on Aug. 26, 2021 entitled Rapid Implementation of High-Temperature Analog Interface Electronics which is a continuation-in-part of U.S. Patent Application Ser. No. 63/070,481 filed on Aug. 26, 2020 entitled Rapid Implementation of High-Temperature Analog Interface Electronics.

STATEMENT REGARDING FEDERALLY SPONSORED RESEARCH OR DEVELOPMENT

Not Applicable.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to improvements in circuit boards for rapidly producing electrical circuits for high temperature operation. More particularly, the invention relates to improvements particularly suited for providing a circuit board template with outrigger connection grid arrays. In particular, the present invention relates specifically to a ceramic wiring board with outrigger connection grid arrays where each surface component pad is connected through the multi-layer ceramic wiring board to multiple associated outrigger connection grid array's similarly located grid points provided as via connections on the board surface.

2. Description of the Known Art

As will be appreciated by those skilled in the art, wiring boards are known in various forms. Patents disclosing information relevant to wiring boards include: U.S. Pat. No. 6,447,888, issued to Suzuki, et al. on Sep. 10, 2002 entitled Ceramic wiring board; U.S. Pat. No. 7,915,690, issued to Shen on Mar. 29, 2011 entitled Die rearrangement package structure using layout process to form a compliant configuration; U.S. Pat. No. 4,930,002, issued to Takenaka, et al. on May 29, 1990 entitled Multi-chip module structure; U.S. Pat. No. 4,811,082, issued to Jacobs, et al. on Mar. 7, 1989 entitled High performance integrated circuit packaging structure; U.S. Pat. No. 4,602,271, issued to Dougherty, Jr., et al. on Jul. 22, 1986 entitled Personalizable masterslice substrate for semiconductor chips; U.S. Pat. No. 4,231,154, issued to Gazdik, et al. on Nov. 4, 1980 entitled Electronic package assembly method; and U.S. Pat. No. 4,221,047, issued to Narken, et al. on Sep. 9, 1980 Multilayered glass-ceramic substrate for mounting of semiconductor device. Each of these patents is hereby expressly incorporated by reference in their entirety.

Advances in electronics that can operate at high temperature (TAMBIENT>190° C.) with out thermal management such as heat dissipation or refrigeration have created the need sensors that can operate in these high-temperature domains as well. As these high-temperature sensors emerge they are integrated with standardized high-temperature data acquisition electronics. Where rapid, low-cost prototyping of low-temperature electronics for low-temperature sensors is readily available there is a need for a rapid, low-cost integration path from standard high-temperature data acquisition electronics to high-temperature sensors as they emerge. An example application is seismic measurements during exploration of geothermal formations. The state of the art is geophone for natural seismology is limited to an operating temperature of 200° C. Therefore, a standard high-temperature data acquisition module that can operate for 1000 hours at 300° C. does not have geophone with a corresponding operating temperature. When 300° C. capable geophone emerges, a custom analog interface circuit will be required to interface the geophone's output signals to the standard high-temperature data acquisition circuit. The present invention provides that solution.

From these prior references it may be seen that these prior art patents and teachings are very limited in their teaching and utilization, and an improved Rapid Implementation of High-Temperature Analog Interface Electronics is needed to overcome these limitations.

SUMMARY OF THE INVENTION

The present invention is directed to an improved Rapid Implementation of High-Temperature Analog Interface Electronics using a ceramic wiring board with component pads and multiple outrigger arrays for surface mounting of components and additive surface trace connection without requiring internal ceramic wiring board modification.

To enable rapid, low-cost interfacing of emerging high-temperature sensors with standard high-temperature data acquisition electronics, a multi-layer (N-layer) ceramic wiring board is patterned with arrays of footprints for high-temperature surface mounted device (SMD) active and passive components. One side of the board is patterned with arrays of standard SMD footprints to enable placement and attachment of components. The standard footprints such as the 0603 (0.06"×0.03"), 0805, 1210 and 2225 provide locations the primary 2-terminal components needed such as resistors, capacitors, inductors and diodes. In addition, a field of component foot-prints are arrayed to receive active components such as high-temperature analog integrated circuits such as operation amplifiers and instrumentation amplifiers. SMD pads are connected through vias and buried-layer interconnect traces to a connection point arrays on the front and back side of the ceramic wiring board. Each pad is connected to multiple instances of the pad grid to connections to be made with a single post-fired print. The ceramic wiring board is then mass produced to provide an inventory of ceramic wiring board analog interface boards. Integration of a new sensors (for example, a geophone) are provided.

These and other objects and advantages of the present invention, along with features of novelty appurtenant thereto, will appear or become apparent by reviewing the following detailed description of the invention.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views.

DETAILED DESCRIPTION OF THE INVENTION

As shown in FIGS. 1 through 6 of the drawings, one exemplary embodiment of the present invention is generally shown as a bare die wiring circuit 100 using a high-temperature multi-layer ceramic outrigger grid wiring board 200 that provides central arrays of standard SMD footprints for minimally populating a circuit with high-temperature active and passive components. Once of the critical problems is the ability to manufacture a high temperature circuit in a short turnaround time using customizable circuitry. This is critical in high temperature applications using silicon carbide and ceramics due to the quick turnaround needed to construct the circuits with the ability to adapt using bare die and the necessity to have wire bond connections directly between the bare die. Once this problem is recognized, wire bond connection for the present invention are maximized in efficiency for both height and length by a concentrated placement of bare die in the center of the board. This allows for direct bare die to bare die connections to provide for both speed and reliability. The ability to pull an premade ceramic wiring board with the ability to have bare die wire bond connections in addition to the post-fire printed additive manufacturing interconnects for other components becomes critical to reduce the supply time. Thus, the present invention provides a modular circuit board with a wire bond connection area in addition to component footprints. In the board, each footprint is connected through buried vias and interconnects to four (or more) vias in four (or more) via arrays (outrigger grid arrays) on the top surface of the ceramic wiring board. the vias can then be connected with surface printing. This enables a wide variety of circuit topologies to be realized with one top layer of printed interconnect.

For quick turnaround, the ceramic wiring boards are mass produced. Then, to quickly manufacture an individual circuit, the circuit topology is designed with a schematic. The interconnects are then post circuit board fire printed using additive manufacturing techniques on the ceramic wiring board and cured. A preferred additive manufacturing techniques is ink jet printing of conductive ink our of an ink jet printer. Next the bare die components are populated to the specified footprint locations and flip-chip attached or wire-bonded and the other components are added to complete the circuit. This approach enabled simple analog interface circuits between emerging high-temperature sensors such as geophones to be connected usefully with standard high-temperature data acquisition circuits.

Figure 1:
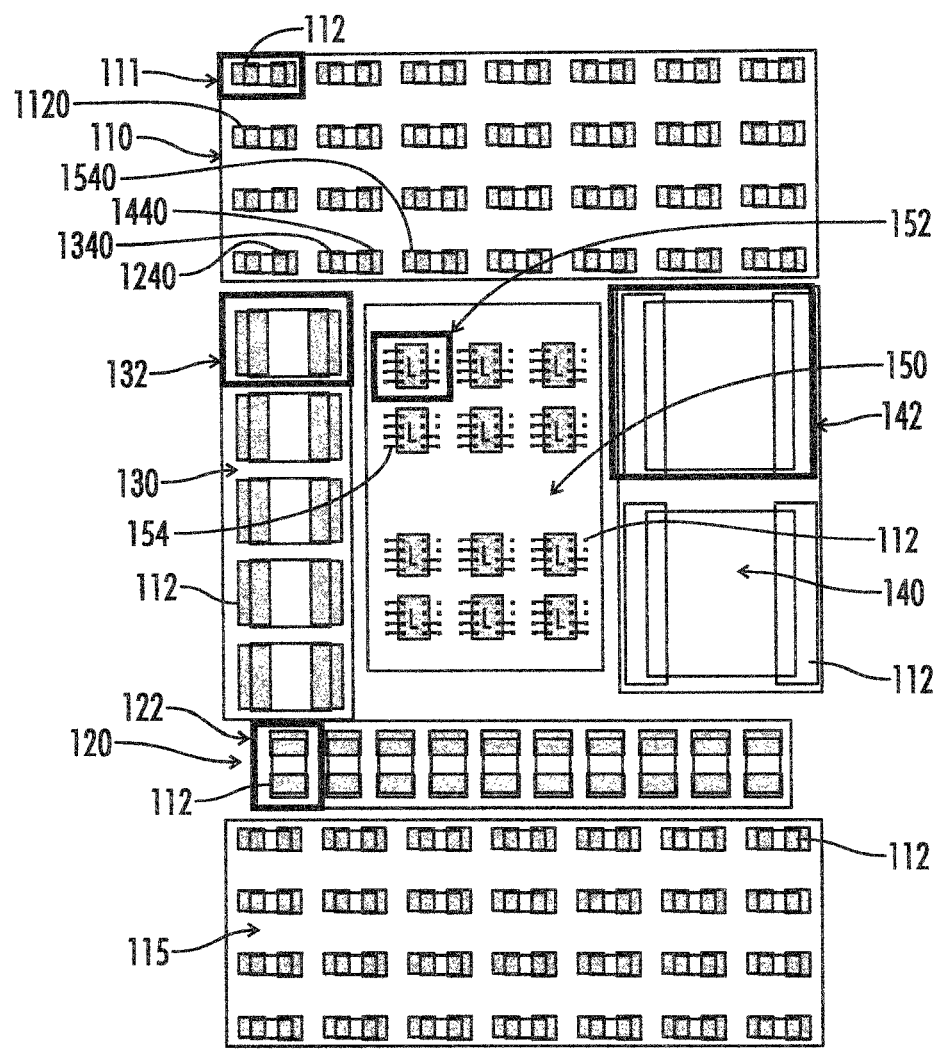
FIG. 1 shows a ceramic wiring board with passive and active component foot-print arrays.

We begin with a description of the central component connection block 102 of the bare die wiring board 100 and will then expand to the outriggers. FIG. 1 shows the central component connection area 102 with the seven component column by four component rows sized mini component footprint array 110 including seven 0603 size discrete component pad mounting blocks 111 with each block 111 including a 0603 size component footprints including two pads 112 to mount Standard SMD 0603 (surface mount devices in the 0603 specification size) which is the most commonly used size discrete component. Called out specifically for later descriptions are the first mini column one line two pad 1120, first mini column two line four pad 1240, first mini column three line four pad 1340, first mini column four line four pad 1440, and first mini column five line four pad 1540. These specific pads will be used to describe how a central component array 110, 115, 120, 130, 140, 150 can be connected to an outrigger grid array 210, 220, 230, 240.

Also shown in the central component connection block 102 is the seven column by four row second mini component footprint array 115, and then the slightly larger vertically oriented component set of the ten column by one row small component footprint array 120 with a 0805 size discrete component pad mounting block 122 with the appropriate individual column line footprints 112.

Next is the one column by four row medium component footprint array 130 with the 1210 size discrete component pad mounting block 132 for Standard SMD 1210 footprints 112, and the one column by two row large component footprint array 140 with the 2225 size discrete component pad mounting area 142 with its footprints 112. Finally, we get the three column by four row bare die component footprint array 150 including the bare die component pad mounting block 152 showing wire bonds 154 to the individual column line footprints 112. Note that where the other components had one footprint, the bare dies have eight individual footprints 112 such that the board is adaptable to different mounting blocks and footprint 112 requirements. Also note that by positioning all of the bare die in proximity to each other, a direct wire bond connection 900 can be made between the bare die. By positioning the bare die first and making the wire bond connections, interference from the installed height of the other components such as a large capacitor 310 is avoided with the wire bonding machinery.

In this manner we see that each central component array 110, 115, 120, 130, 140, 150 has one or more individual column line footprints 112 that can be used to make connections. Now we can consider how to individually connect a single footprint to multiple grid vias 208 within the outrigger grid arrays 210, 220, 230, 240.

Figure 2:
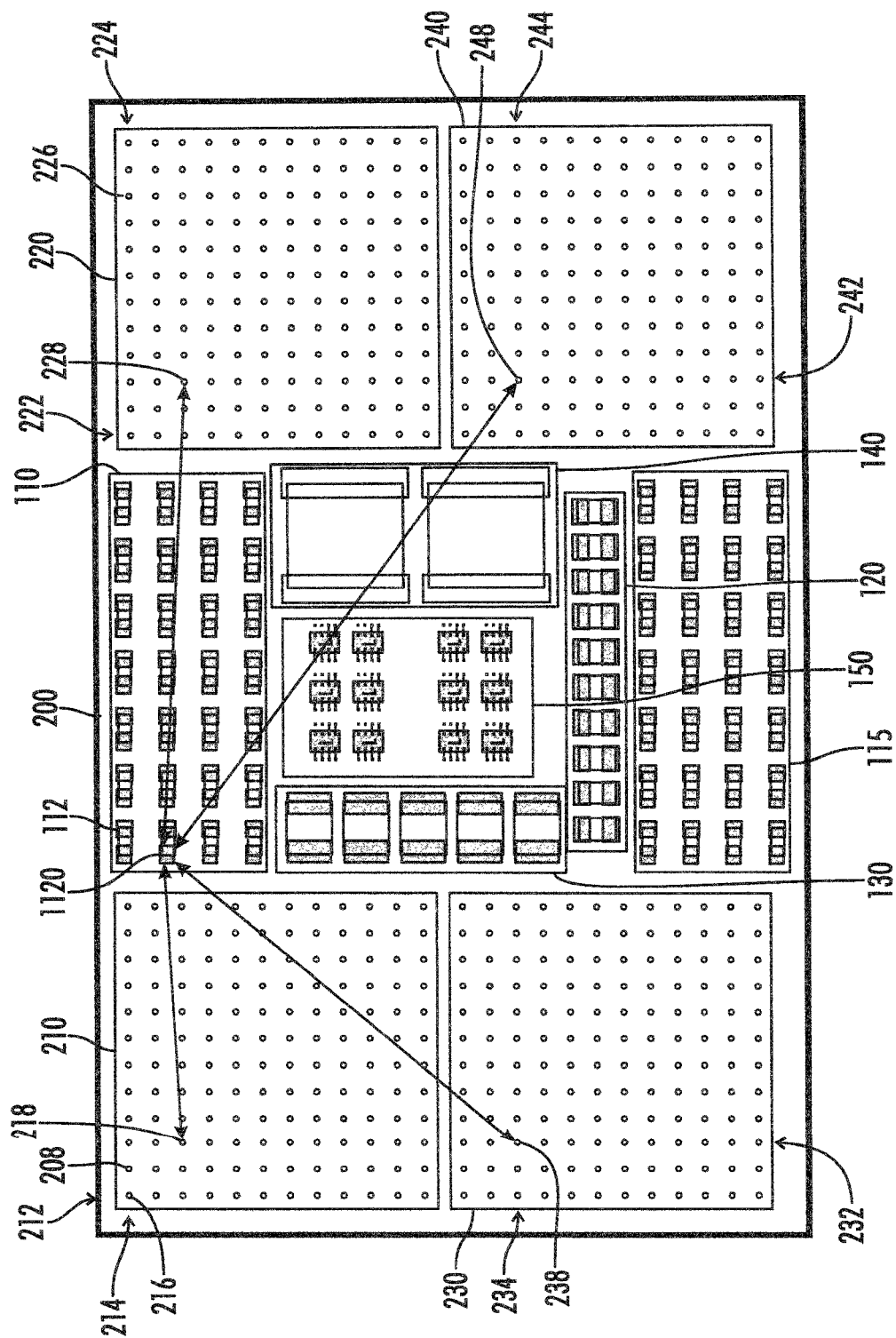
FIG. 2 shows four outrigger connection grid arrays where each surface component pad is connected through the multi-layer ceramic wiring board to an associated grid point on the board surface.
Figure 5:
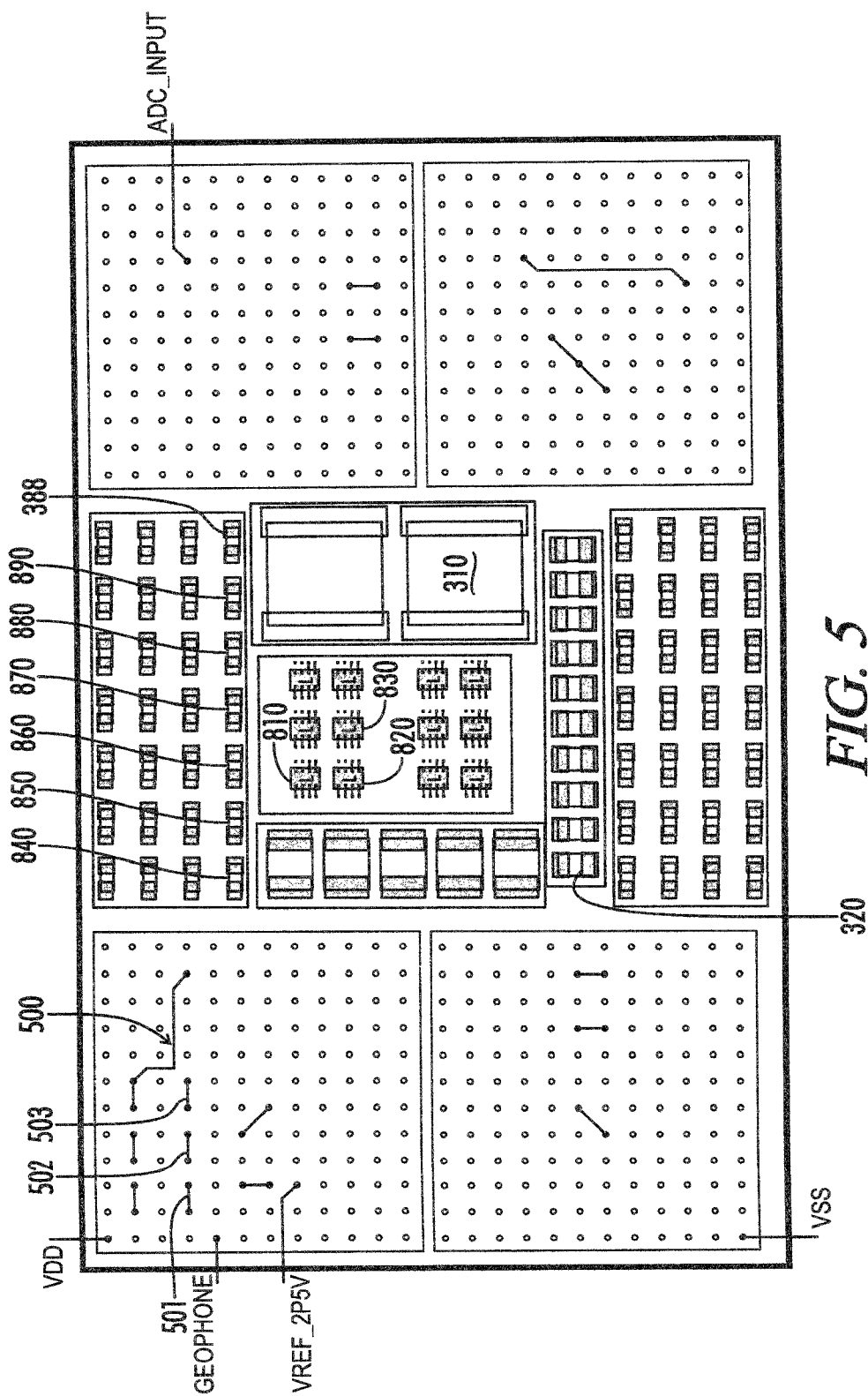
FIG. 5 shows the component layout on the board and the additive manufacturing by post-fire printed interconnects with the ceramic wiring board minimally populated with active and passive components.
Figure 6:
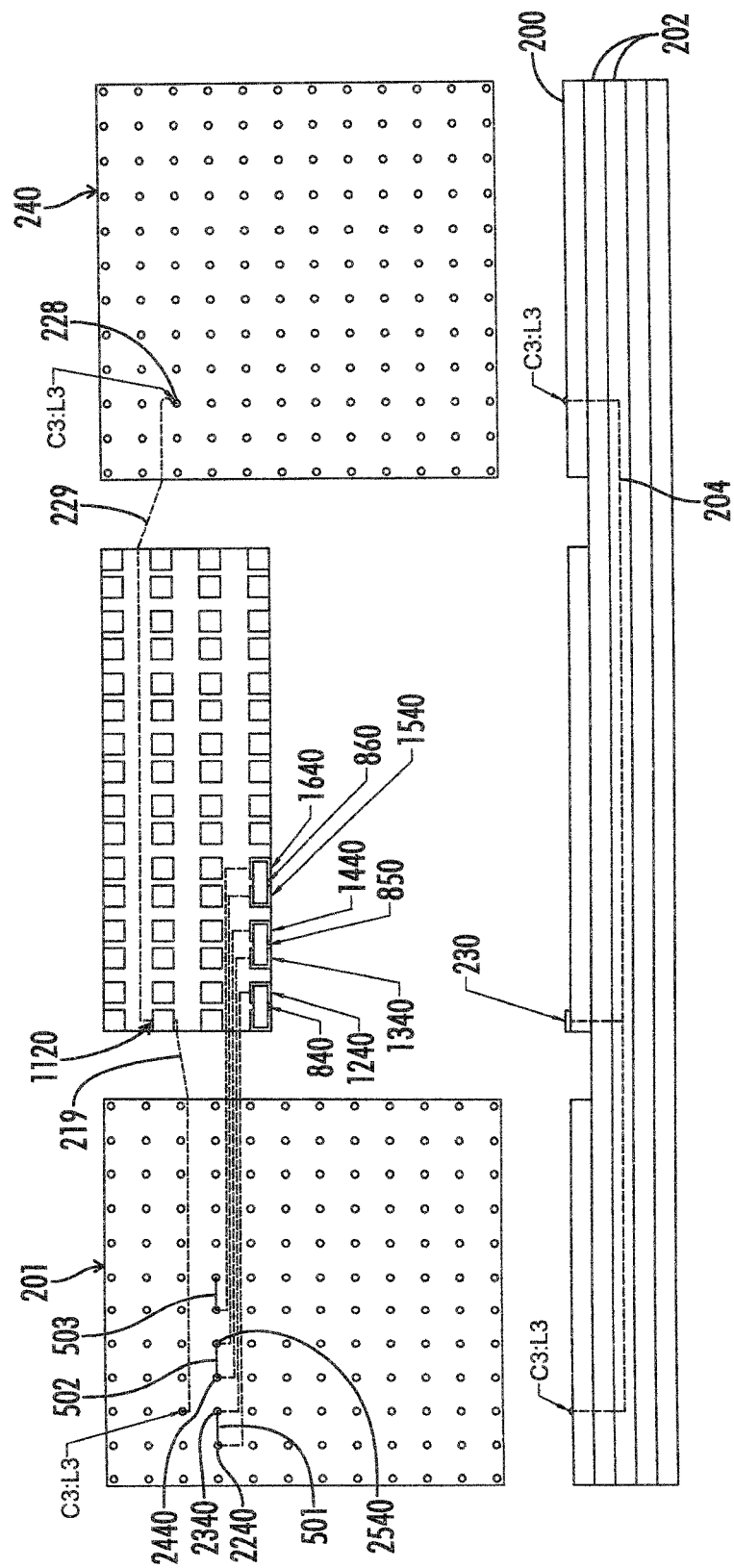
FIG. 6 shows the dashed line internal tracks in the ceramic wiring board for connecting grid points C3:L3 on different outrigger connection grid arrays to an individual connection pad in a component block.

FIGS. 2 and 5 show top views and FIG. 6 shows a partial view of the ceramic outrigger grid wiring board 200 using the central component connection block 102 with the central component arrays 110, 115, 120, 130, 140, 150 with footprints 112 that are connected to vias 208 in each of the four outrigger grid arrays 210, 220, 230, 240. Shown in this embodiment are the first outrigger via grid array 210 with a first array column 212 and first array row 214. At each column 212 and row 214 is a first array column line connection via 216. Of particular note is the first grid column three line three via 218. The first grid column three line three via 218 is connected by the first grid column three line three trace 219 (FIG. 6) to the first mini column one line two pad 1120. Also labeled for later description in the first outrigger via grid array 210 is the first outrigger column two line four pad 2240, the first outrigger column three line four pad 2340, the first outrigger column four line four pad 2440, and the first outrigger column five line four pad 2540 which will be described in the circuitry discussion below.

Also shown is the second outrigger via grid array 220 with the second array column 222, and second array row 224 with a second array column line connection via 226 at each column and row point. Of particular note is the second grid column three line three via 228 which is also connected by the second grid column three line three trace 229 to the first mini column one line two pad 1120. Thus, we can see that each array column line footprint 112 is connected by internal traces to the same column row individual grid via 208 located at the same column and row point location in each of the four outrigger grid arrays 210, 220, 230, 240. Thus, an electrical connection can be made to first mini column one line two pad 1120 by connecting at the column three line three via at any of the four outrigger grid arrays 210, 220, 230, 240. From this we can now understand the third outrigger via grid array 230 with the third array column 232 and the third array row 234 defining the third array column line connection via 236. Thus, we can understand that the third grid column three line three via 238 is also connected by an internal trace to the first mini column one line two pad 1120. Similarly for the fourth outrigger via grid array 240 with the fourth array column 242 and fourth array row 244 defining the fourth array column line connection via 246 will have the fourth grid column three line three via 248 connected by an internal trace to the first mini column one line two pad 1120. Thus, as noted in FIG. 6, the ceramic outrigger grid wiring board 200 includes board layers 202 housing multiple internal component grid traces 204. Each internal component grid trace 204 connects an individual footprint 112 with an individual grid via 208 located at the same position in any of the four outrigger grid arrays 210, 220, 230, 240. So to connect to that component, all we need is a top level printed trace conductor 250 as shown in FIG. 5 so we can now look at a circuit implementation on the ceramic wiring board.

Figure 3:
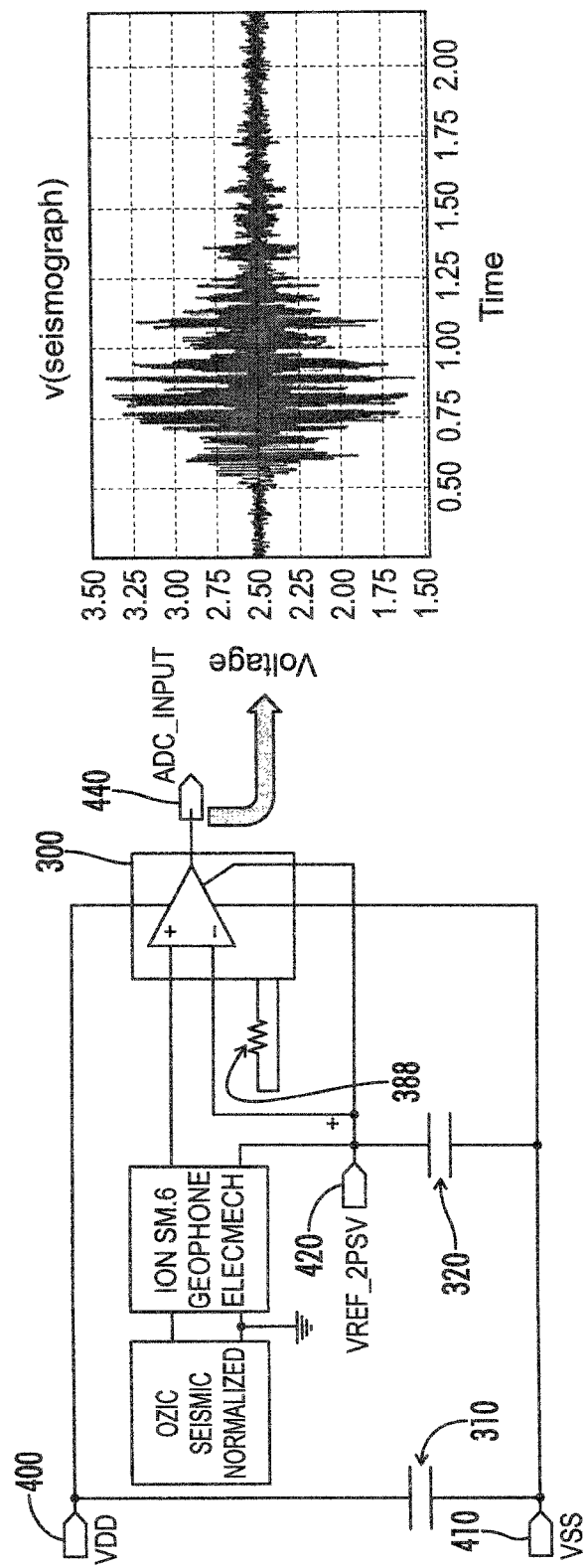
FIG. 3 is an example of interfacing a high-temperature geophone with a standard analog-to-digital converter input range of 0-5 V—instrumentation amplifier with gain setting resistor and power supply and reference voltage noise suppression capacitors.

FIG. 3 shows an example of an application for a high-temperature ceramic wiring board analog array to interface geophone with analog-to-digital converter using a high temperature instrumentation amplifier 300 with gain of 20X, with gain-setting resistor 388, voltage-reference-noise suppression capacitor 320 and power supply noise suppression capacitor 310. A voltage reference of 2.5 V 420 provides a midpoint value of 2.5 V for the ADC_INPUT 440. The instrumentation amplifier 300 provide a 0 to 5V output signal to access all the available resolution of the ADC. The power supply operates of VDD 400 and VSS 450.

Figure 4:
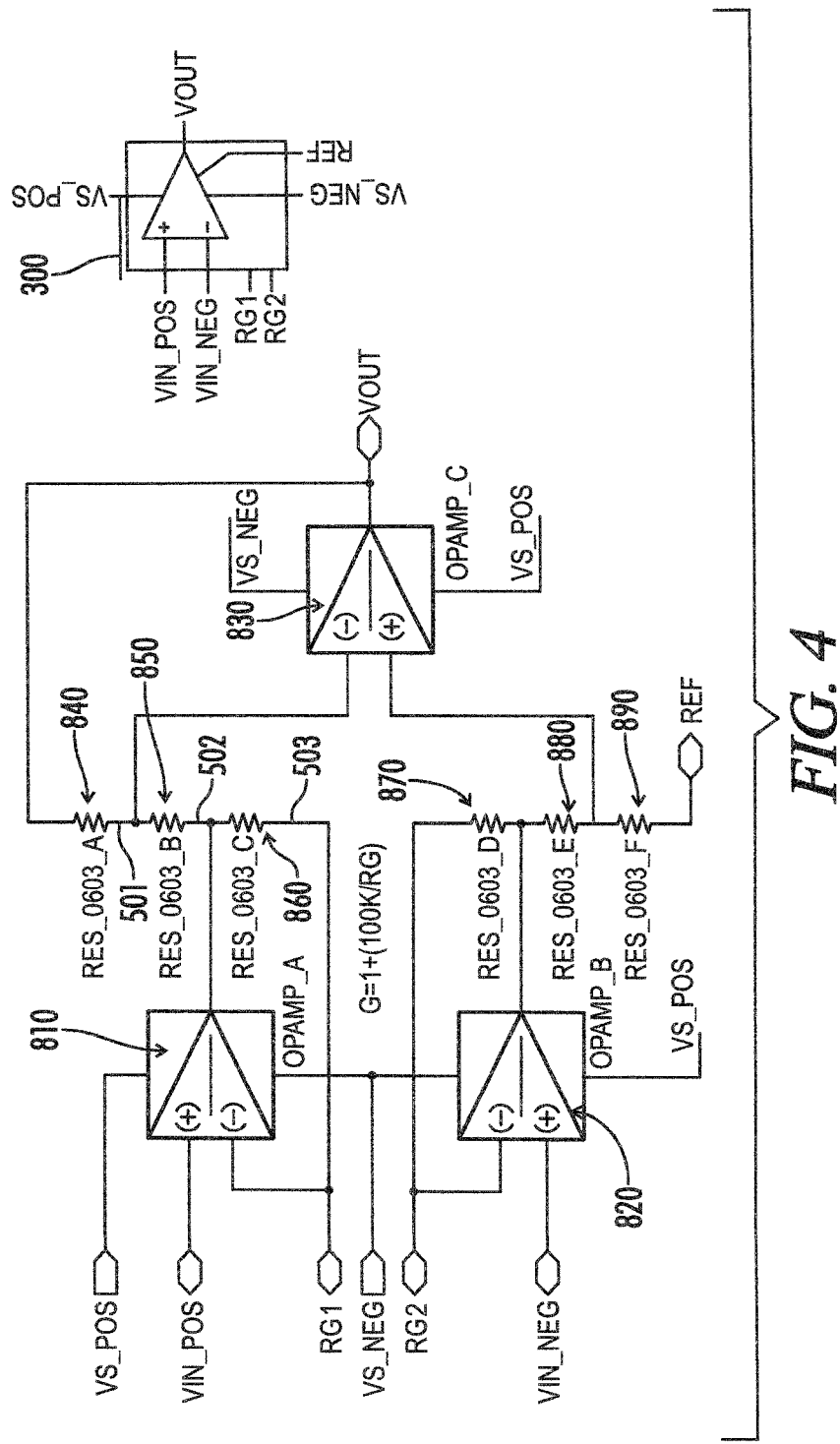
FIG. 4 shows the instrumentation amplifier implemented with three operational amplifiers and six resistors

FIG. 4 shows the high temperature instrumentation amplifier 300 is comprised of 3 operational amplifiers, 310, 320, 330, and gain conditioning resistors 340, 350, 360, 370, 380, 390.

FIG. 5 now shows how the ceramic wiring board 200 is printed with top level conductors 500 to make all the connections to the ceramic wiring board inputs, 420 and ground, its power supply 400, 410, and output 440 to drive the ADC input. Specifically look at the printed on trace for the first resistor connection 501. Here we can see that the first mini column two line four pad 1240 is connected via an internal trace to the first outrigger column two line four pad 2240 which is connected by the surface ink jet printed first resistor connection 501 to the first outrigger column three line four pad 2340 which then connected by a different internal trace to the first mini column three line four pad 1340. This is the connection between first resistor 840 and second resistor 850. Also shown is the first mini column four line four pad 1440 connected via internal trace to the first outrigger column four line four pad 2440 connected by ink printed surface trace 502 to the first outrigger column five line four pad 2540 which is then connected by internal trace to the first mini column five line four pad 1540 for the second resistor 850 to third resistor 860 connection. Now we can see how to quickly build a circuit using this board 200, the printed conductors 500, 801, 502, 503 and adding components 810, 820, 830, 840, 850, 860, 870, 880, 890.

After the top level connections 500 et seq. are printed and cured on the ceramic wiring board, the bare die components are flip-chip attached or wire bonded to their footprint pad sites to complete the circuit for the instrumentation amplifier 300 with the final components being the resistors and noise suppression capacitors. In this manner, centralized direct bare die to bare die wire bonding is provided with all of the components placed on their component pads and the component pads are connected through internal ceramic wiring board tracks to the grid points in the via arrays, and the grid points are connected using surface printed traces shown as top level connections 500 printed in the spacing between the grid points to connect one or more grid array points to form the circuit. The top level connections 500 are routed in the space between the grid points on any one of the arrays. In this manner, a ceramic wiring board 200 is provided that allows for later component selection and printed on connections in a quick surface modification only system.

top level ink jet surface printed conductors 500
    Gain setting resistor 500
    first noise suppression capacitors 510
    second noise suppression capacitors 520
    bare die wiring board 100
    central component connection block 102
    first mini component footprint array 110
        0603 size discrete component pad mounting block 111
        footprint pad 112
        first mini column one line two pad 1120
        first mini column two line four pad 1240
        first mini column three line four pad 1340
        first mini column four line four pad 1440
        first mini column five line four pad 1540
    second mini component footprint array 115
    small component footprint array 120
        0805 size discrete component pad mounting block 122
    medium component footprint array 130
        1210 size discrete component pad mounting block 132
    large component footprint array 140
        2225 size discrete component pad mounting area 142
    bare die component footprint array 150 bare die component pad mounting block 152
ceramic outrigger grid wiring board 200
  board layers 202
  internal component grid trace 204
  individual grid via 208
  first outrigger via grid array 210
    first array column 212
    first array line 214
    first array column line connection via 216
    first grid column three line three via 218
    first grid column three line three trace 219
    first outrigger column two line four pad 2240
    first outrigger column three line four pad 2340
    first outrigger column four line four pad 2440
    first outrigger column five line four pad 2540
  second outrigger via grid array 220
    second array column 222
    second array line 224
    second array column line connection via 226
    second grid column three line three via 228
    second grid column three line three trace 229
  third outrigger via grid array 230
    third array column 232
    third array line 234
    third array column line connection via 236
    third grid column three line three via 238
  fourth outrigger via grid array 240
    fourth array column 242
    fourth array line 244
    fourth array column line connection via 246
    fourth grid column three line three via 248
  top level printed trace conductor 250
high temperature instrumentation amplifier 300
power supply noise suppression capacitor 310
voltage-reference-noise suppression capacitor 320
gain-setting resistor 388
power supply 400
ceramic wiring board voltage reference 420
ceramic wiring board input 430
analog to digital conversion input 440
ground connection 450
top level ink jet surface printed conductors 500
Gain setting resistor 500
first noise suppression capacitors 510
second noise suppression capacitors 520
first operational amplifier 810
second operational amplifier 820
third operational amplifier 830
first gain conditioning resistor 840
second resistor 850
third resistor 860
fourth resistor 870
fifth resistor 880
sixth resistor 890
Direct wire bond connection 900

From the foregoing, it will be seen that this invention well adapted to obtain all the ends and objects herein set forth, together with other advantages which are inherent to the structure. It will also be understood that certain features and subcombinations are of utility and may be employed without reference to other features and subcombinations. This is contemplated by and is within the scope of the claims. Many possible embodiments may be made of the invention without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'ing' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' 'having,' or 'including' should be interpreted as open ended claim language that allows additional elements or structures. Finally, where the claims recite "a" or "a first" element of the equivalent thereof, such claims should be understood to include incorporation of one or more such elements, neither requiring nor excluding two or more such elements.

What is claimed is:

1. A ceramic wiring board for components, comprising:
a ceramic wiring board including a plurality of board layers defining a board surface and an internal section;
footprint arrays including component footprints for mounting the components on the board surface,
the component footprints connected through internal traces to the same position in a plurality of outrigger grids,
each outrigger grid having connection vias with sufficient spacing to allowing surface only additive manufacturing to connect selected vias thereby connecting the component footprints through their corresponding internal traces.

2. The ceramic wiring board of claim 1 where there are enough footprint arrays to implement multi-stage instrumentation amplifiers, active filters, and signal conditioning circuits.

3. The ceramic wiring board of claim 1 implementing a minimally populated instrumentation amplifier for a high-temperature geophone.

* * * * *